United States Patent

Brown

[11] 4,034,168
[45] July 5, 1977

[54] DEVICE TO DETECT AND AUTOMATICALLY CONTROL ELECTRICAL POTENTIAL POLARITIES

[76] Inventor: Robert Kenneth Brown, 147 Marine Drive, Apt. 5-D, Buffalo, N.Y. 14202

[22] Filed: Dec. 2, 1974

[21] Appl. No.: 528,777

[52] U.S. Cl. .................................... 191/2; 191/14; 361/246
[51] Int. Cl.² ...................................... B60L 9/04
[58] Field of Search ................. 191/1, 2, 3, 6, 37, 191/38, 14–21; 104/147 R, 147 A, 60, 153; 246/114 R, 114 A, 254, 256, 226, 169; 317/8

[56] References Cited

UNITED STATES PATENTS

| | | | |
|---|---|---|---|
| 1,795,242 | 3/1931 | Adsit | 191/3 |
| 2,794,867 | 6/1957 | Sawyer | 191/37 |
| 3,273,039 | 9/1966 | Godshalk et al. | 317/8 X |
| 3,588,828 | 6/1971 | Scholein | 340/172 |

Primary Examiner—Robert B. Reeves
Assistant Examiner—Joseph J. Rolla
Attorney, Agent, or Firm—Raymond F. Kramer

[57] ABSTRACT

A device to detect and control electrical potential polarities between two or more adjacent insulated conductor sections is disclosed. An amplifying circuit monitors the relative state of the polarities of the adjacent conductor sections and actuates a relay to change the same if a difference is sensed. The sensing function of the amplifying circuit is controlled by a switch member.

10 Claims, 1 Drawing Figure

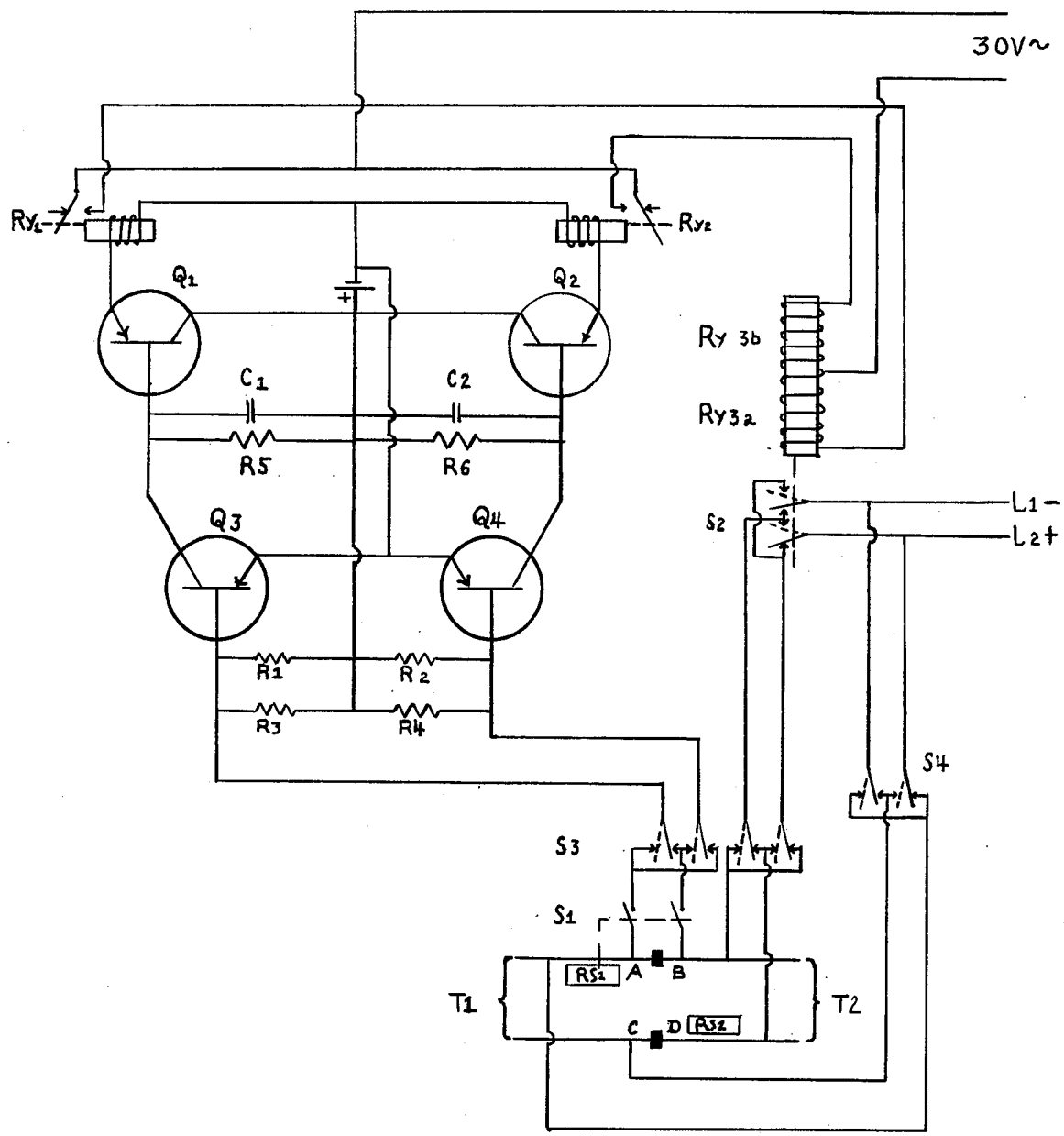

DEVICE TO DETECT AND AUTOMATICALLY CONTROL ELECTRICAL POTENTIAL POLARITIES

DRAWING DESCRIPTION

Illustrated is one complete circuit and switching arrangement necessary to control polarities of one section of track or conductors.

It will be noted that all switches, relays and wiring are in such and correct manner as to provide similar electrical potential polarities at points A-B and C-D where A is insulated from B and C is insulated from D.

DETAILED DESCRIPTION:

Application of direct current to L1-L2 causes similar electrical potential polarities to appear at A-B and C-D with switches and relays as drawn (solid lines). If polarities at A and C are reversed, as by means of S4, which represents either a manual two-pole, double-throw switch or another detector controlled relay similar to Ry3 which is a double-acting, positive-position relay incorporating and mechanically controlling S2, a negative voltage appears at A. When S1, which is a double pole, normally open, momentary contact switch, is operated, current flows through R3 and R4 causing a voltage drop across those resistors. Since Q1-Q4 are PNP transistors, the negative potential will be significant. The negative potential appears at base of Q4, is amplified to sufficient strength to bias Q2 into conduction through the emitter-collector circuit which activates Ry2 which in turn activates Ry3b whose contact points S2 are wired to cause reversal of polarity upon activation, causing S2 to switch to dotted position causing a negative potential to appear at B. Since A and B are now at similar potential and polarity, no current flows through R3-4 when S1 or RS1 are activated. In this state no further activity or operation will occur until something is done to reverse the polarities of T1 or T2.

When S3 is switched to dotted position this causes a negative potential to appear at B. Closing of S1(RS1) allows current to flow through R3-R4 and a negative voltage at base of Q4 which is amplified to a strength sufficient to bias Q2 into conduction through the emitter-collector circuit, energizing Ry2 which energizes Ry3, switching S2 to dotted position reversing polarities of T2. This gives B and A positive polarities; therefore, no voltage drop exists across R3-4 and there is no further activity or operation until something is done to reverse polarities of T1 or T2.

At base of Q3 and Q4 a potential of no more than −1.5 volts with PNP transistors, and of at least +1.5 volts with NPN transistors is necessary to provide stable operation of detection and polarity control. Sensitivity of the detector can be increased by adding one more stage of amplification ahead of Q3 and Q4.

S1 can can be either console or control panel operated or remotely located (RS1) incorporated within a section of track specifically designed for that purpose. Remotely RS1 (S1) would be operated by means mechanical attached to an engine. Another remote switch, RS2 (S2), would be located diagonally opposite RS1 in section T2 on opposite side of track insulator (-■-). S2 or RS2 would be inserted ahead of S4. S4 would then represent another double-pole, double-throw positive position, AC operated relay controlled by another detector. This would allow fully automatic control at these two sections.

For fully automatic operation, one detector as drawn would be required at each rail junction where the rail connection, if made, would cause a short circuit. Each detector would control the polarity of a section of track ahead of the direction of travel.

It is necessary that the detectors have a constant DC power supply independent of the power at the rails. All detectors may be wired to the same supply.

I claim:

1. An apparatus for detecting differences in polarity between a pair of separate conductors and changing the polarity of one such conductor so as to make both conductors of the same polarity which comprises means for selectively applying the same and different electrical polarities to the conductors, amplifying means and first relay means, means in contact with both such conductors and actuatable when they are of different polarities to impose a potential difference across said amplifying means, said amplifying means producing an amplified potential to operate said first relay means when said potential difference is impressed across it and means coupled to said first relay means for reversing the polarity of one of the conductors so as to make them both of the same polarity.

2. An apparatus according to claim 1 wherein the conductors of different polarities are aligned sections of track, separated by an insulator, for a direct current operated electric train and wherein the means in contact with the aligned insulated conductors and actuatable when they are of different polarities to impose a potential difference across the amplifying means includes a remote switch operated via means on an engine passing over the track and the polarity reversal is of the section thereon onto which the engine of the train is moving from the other section.

3. An apparatus according to claim 1 wherein the amplifying means includes a source of direct current and a transistor and said reversing means comprises a second relay means which is actuated by the first relay means.

4. An apparatus according to claim 3 wherein the means in contact with both conductors and actuatable when they are of different polarities to impose a potential difference across the amplifying means includes a switch, the amplifying means includes a pair of transistors in series to amplify the potential to the first relay means, the first relay means is so communicated with the second relay means as to close a circuit when actuated to supply alternating current to the second relay means which thereupon disconnects a source of electrical potential from one of the conductors and connects to said one of the conductors a source of electrical potential of opposite polarity which is of the same polarity and magnitude as that of the other conductor.

5. An apparatus according to claim 4 wherein the conductors are aligned and separated by an insulator, the switch including means in contact with both conductors and actuatable when they are of different polarities to impose a potential difference across the amplifying means includes a remote switch and means for actuating such remote switch, the amplifying means includes PNP transistors, to a first of which a potential of no more than minus 1.5 volts is applied and the amplifying circuit includes an emitter-collector circuit.

6. An apparatus according to claim 5 which comprises two pairs of the aligned and insulated conductors, parallel to each other, with the conductors that are non-aligned and opposite to each other being of opposite polarities, a pair of amplifying circuits and a pair of first relays, separately associated with such circuits, which amplifying circuits are separately actuatable depending on the polarities of the conductors of one of the pairs of conductors, to separately actuate the first relays which separately actuate said second relay to selectively disconnect sources of electric potential from a pair of opposite conductors and connect to said conductors sources of electric potential of opposite polarities.

7. An apparatus according to claim 6 wherein the conductors of different polarities are aligned sections of track for a direct current operated electric train, the remote switch is operated by means on an engine passing over the track and the polarity reversal is of the section thereof onto which the engine of the train is moving from the other section.

8. An apparatus according to claim 7 wherein the means on the engine passing over the track for contacting the conductors and actuating the remote switch are means for making contact with two pairs of such conductors, which are railroad tracks.

9. An apparatus according to claim 4 wherein the conductors are aligned and separated by an insulator, the switch including means in contact with both conductors and actuatable when they are of different polarities to impose a potential difference across the amplifying means includes a remote switch and means for actuating such remote switch, the amplifying means includes NPN transistors, to a first of which a potential of no more than 1.5 volts is applied and the amplifying circuit includes an emitter-collector circuit.

10. An apparatus according to claim 9 which comprises two pairs of the aligned and insulated conductors, parallel to each other, with the conductors that are non-aligned and opposite to each other being of opposite polarities, a pair of amplifying circuits and a pair of first relays, separately actuatable depending on the polarities of the conductors of one of the pairs of conductors, to separately actuate the first relays which separately actuate said second relay to selectively disconnect sources to electric potential from a pair of opposite conductors and connect to said conductors sources of electric potential of opposite polarities.

* * * * *